United States Patent
Heid

[19]

[11] Patent Number: 6,157,191
[45] Date of Patent: Dec. 5, 2000

[54] METHOD FOR FAST FOURIER TRANSFORMATION FOR NUCLEAR MAGNETIC RESONANCE SIGNALS ARRANGED IN A MATRIX HAVING AN ARBITRARY MATRIX SIZE

[75] Inventor: Oliver Heid, Bern, Switzerland

[73] Assignee: Siemens Aktiengesellschaft, Munich, Germany

[21] Appl. No.: 08/776,149

[22] PCT Filed: Jul. 5, 1995

[86] PCT No.: PCT/DE95/00871

§ 371 Date: Jan. 10, 1997

§ 102(e) Date: Jan. 10, 1997

[87] PCT Pub. No.: WO96/02851

PCT Pub. Date: Feb. 1, 1996

[30] Foreign Application Priority Data

Jul. 20, 1994 [DE] Germany ............................. 44 25 727

[51] Int. Cl.[7] .............................. G01R 33/20; G01V 3/00
[52] U.S. Cl. ........................................... 324/307; 324/314
[58] Field of Search ..................... 324/307, 306, 324/309, 300–322, 314

[56] References Cited

U.S. PATENT DOCUMENTS 5,168,226  12/1992  Hinks ...................... 324/309

FOREIGN PATENT DOCUMENTS 0 453 102  10/1991  European Pat. Off. .

OTHER PUBLICATIONS

"Hi–Resolution NMR Chemical–Shift Imaging with Reconstruction by the Chirp z–Transform," Ma et al., IEEE Trans. on Med. Imaging, vol. 9, No. 2, Jun., 1990, pp. 190–201.
"Vergleichende Bewertung der Chirp–Z–Transformation (CZT) und der Fast–Fourier Transformation (FFT)," Pfeiffer et al., Elektrie, vol. 47, No. 10 (1993), pp. 370–374.

Chirp–Z Transform Efficiently Computed Frequency Spectra, Lyons, EDN–Electrical Design News, vol. 34, No. 11 (1989) pp. 161–170.
"Segmented Chirp Z–transform and Its Applications," Wang, Proceedings of ICASSP 89, IEEE Press, vol. 2, May 23–26, 1989, pp. 1003–1006.
"A Real–time NMR Image Reconstruction System Using Echo–planar Imaging and a Digital Signal Processor," Kose et al., Measurement Science & Technology, vol. 3, No. 12, (1992) pp. 1161–1165.
"The Design and Analysis of Computer Algorithms," Aho et al., Addison–Wesley Publishing Co., pp. 257–264.
"Fast Fourier Transform and Convolution Algorithms," 2nd Ed., Nussbaumer (Springer–Verlag 1982) pp. 112–115.
"Digitale Signalverarbeitung," Schüssler, Springer–Verlag (1988), pp. 70–72.
Rabiner, L.R. schafer, R.W., Rader, C.M., The Chirp z–transformation and its applications; Bell System Technical Journal, 48, 1249–1292, 1969.

(List continued on next page.)

*Primary Examiner*—Christine K. Oda
*Assistant Examiner*—Tiffany A. Fetzner
*Attorney, Agent, or Firm*—Schiff Hardin & Waite

[57] ABSTRACT

A Fourier transformation in a measured data matrix (MD) with the discrete measured data $(x_{j,k})$ is implemented for all k=0 . . . N–1, respectively in the following steps, whereby it is defined: $w=e^{-2i\pi/N}$
a) The measured signals $(x_{j,k})$ are acquired with an rf-phase modulation of the nuclear magnetic resonance signals according to a chirp function $w^{j^2/2}$,
b) The arising data are convoluted with a second chirp $(w^{-(j-k)^2/2})$ and entered into an auxiliary data matrix (HD),
c) The image data matrix is acquired from the auxiliary data matrix (HD) by Fourier transformation in at least one further direction.

8 Claims, 3 Drawing Sheets

OTHER PUBLICATIONS

Rabiner, L.R. schafer, R.W. Rader, C.M., The Chirp z–transorm algorithm, IEEE Transactions Of Audion and Electroacoustics, vol. AU–17, Jun. 1969, pp. 86–92.

Oppenheim A.V. and R. W. Schaffer, Digital Signal Processing, Prentice–Hall, 1975, pp. 321–326.

Gaskill Jack D., Linear Systems, Fourier Transforms and Optics, John Wiley & Sons New York 1978 Chapter 6 pp. 150–157 and Chapter 7 pp. 196–200.

Merriam Webster's Collegiate Dictionary Tenth Edition 1997 Biographical Names section p. 1411.

| MAT. LENGTH | FFT | CZT | DFT | RATIO | | |
|---|---|---|---|---|---|---|
| 32 | 608 | 3840 | 7936 | 1 : | 6.32 : | 13.05 |
| 64 | 1536 | 8960 | 32256 | 1 : | 5.83 : | 21.00 |
| 128 | 3712 | 20480 | 130048 | 1 : | 5.52 : | 35.03 |
| 256 | 8704 | 46080 | 522240 | 1 : | 5.29 : | 60.00 |
| 512 | 19968 | 102400 | 2093056 | 1 : | 5.13 : | 104.82 |
| 1024 | 45056 | 225280 | 8380416 | 1 : | 5.00 : | 186.00 |

FIG 10  NO. OF REQUIRED CALCULATING OPERATIONS

METHOD FOR FAST FOURIER TRANSFORMATION FOR NUCLEAR MAGNETIC RESONANCE SIGNALS ARRANGED IN A MATRIX HAVING AN ARBITRARY MATRIX SIZE

FIELD OF THE INVENTION

The invention is directed to a method for image acquisition from measured data of a nuclear magnetic resonance experiment that are entered into a measured data matrix with discrete k-space points, whereby a image matrix with image data is acquired from the measured data matrix by Fourier transformation, and whereby an image is displayed on the basis of the image data matrix.

DESCRIPTION OF THE PRIOR ART

A method of the above general type is disclosed, for example, in U.S. Pat. No. 5,168,226.

In traditional methods, the Fourier transformation required for image production is implemented according to what is referred to as an FFT (Fast Fourier Transform) algorithm, as described, for example, by Alfred v. Aho et al. in "The Design and Analysis of Computer Algorithms", Addison-Wesley Publishing Company, pages 257 through 264. This algorithm is very efficient since it requires only a fraction of the calculating operations compared to discrete Fourier transformation, however, it can only be applied when the length of the dataset to which the algorithm is to be applied represents a power of a whole number. The FFT method is usually applied to datasets having a length of $2^n$.

The limitation to specific dataset lengths, however, is undesirable for certain applications. For three-dimensional datasets, for example, the resolution within a slice should thus be capable of being arbitrarily set. This can in fact be achieved without further difficulty with a discrete Fourier transformation, however, the number of required calculating operations and thus the required calculating time, increases drastically. For example, given a dataset length of 512 more than one hundred times as many calculating operations are required for the discrete Fourier transformation than given the FFT algorithm.

Chirp-z transformation as disclosed in European Application 0 453 102 in its application to MR imaging is a method for image calculation that is independent of the dataset length. This method is noticeably faster than discrete Fourier transformation.

Utilizing a "Chirp-Z transformation" for the realization of a discrete Fourier transformation is known for certain applications such as, for example, "charge coupled devices" from the reference "Henry Nussbaumer, Fast Fourier Transform and Convolution Algorithms", Springer-Verlag, 1982, pages 112–115.

The technique of "Chirp-z Transformation" is explained in general for digital signal processing in the book, "Digitale Signalverarbeitung", Vol. I, H. W. Schüssler, Springer Verlag 1988, pp. 70–72.

The reference, "IEEE Transactions on Medical Imaging", Vol. 9, No. 2, Jun. 2, 1990, pp. 190–201, describes the application of a chirp-z transformation for chemical shift imaging with magnetic resonance apparatus. This transformation is thereby utilized as substitute for the Fourier transformation for acquiring the spectrum, and an improved, spectral resolution is thus achieved. The Fourier transformation is utilized for the topical resolution, as usual.

The reference "Electrical Design News", Vol. 34, 1989, pages 161–170 describes the application of chirp-z transformation to the calculation of frequency spectra.

SUMMARY OF THE INVENTION

An object of the present invention is to implement a method for image reconstruction in a nuclear magnetic resonance tomography apparatus such that measured data matrices of an arbitrary size can be processed given low calculating time.

The above object is achieved in accordance with the principles of the present invention in a method for image acquisition from nuclear magnetic resonance measured data $(x_{j,k})$ which are entered into a measured data matrix with discrete k-space points (j,k), with a Fourier transformation being implemented in a first direction for all k=0 ... N−1 (wherein N is the number of rows in the matrix) and wherein the measured signals $(x_{j,k})$ are acquired with an RF-phase modulation of the nuclear magnetic resonance signals according to a chirp function $w^{k^2/2}$, wherein the resulting data are convoluted with a second chirp function $w^{-(j-k)^2/2}$, and are entered into an auxiliary data matrix, wherein an image data matrix containing the image data $(x_{j,k})$ is acquired from the auxiliary data matrix by Fourier transformation in at least one further direction, wherein an image is then displayed on the basis of the image data matrix, and wherein $w=e^{-2\pi/N}$.

DESCRIPTION OF THE DRAWINGS

FIG. 10 is a table showing the dependency of the required calculating steps on the Fourier transformation method which is used.

DESCRIPTION OF THE PREFERRED EMBODIMENTS

The convention spin-warp sequence of FIGS. 1 through 5 is merely intended to serve for explaining the problem addressed by the invention method. It must be emphasized that the inventive method can be applied for all pulse sequences wherein the information about the spatial origin of the signal contributions required for image generation are coded in phase factors of the nuclear magnetic resonance signal. Given the example of a pulse sequence shown in FIGS. 1 through 5, a frequency-selective radio-frequency pulse RF is first emitted in under the influence of a slice selection gradient $G_S$. Nuclear spins are excited in only one slice of the examination subject under the influence of the slice selection gradient $G_S$. Subsequently, the dephasing caused by the positive sub-pulse of the slice selection gradient $G_S$ is in turn cancelled by a negative sub-pulse $G_S^-$. Further, a phase-coding gradient $G_P$ is emitted. Finally, a negative readout gradient $G_R^-$ is also activated.

Only a positive readout gradient $G_R^+$ is activated during the following readout phase. The arising echo signal is sampled M times and the M measured values acquired in this way are entered into a row of a measured data matrix MD according to FIG. 6.

The illustrated pulse sequence is repeated N times with different values of the phase-coding gradient $G_P$, so that a measured matrix with N rows is obtained overall. Usually, the phase-coding gradient is thereby switched in equal steps from the highest positive to the highest negative value or vice versa from pulse sequence to pulse sequence. The measured data matrix MD can be considered as a measured space, as a measured data plane in the two-dimensional case of the exemplary embodiment. This measured data space is referred to as "k-space" in nuclear magnetic resonance tomography.

The information about the spatial origin of the signal contributions required for the image generation is coded in the phase factors, whereby the relationship between the locus space and the k-space mathematically exists via a Fourier transformation. Valid is:

$$S(k_x,k_y) = \int \int \rho(x,y) e^{i(k_x x + k_y y)} dx dy$$

The following definitions thereby apply:

$$k_x(t) = \Upsilon \int_0^t G_R(t') dt'$$

$$k_y(t) = \Upsilon \int_0^t G_P(t') dt'$$

Figure 1:
FIGS. 1–5 illustrate a conventional spin-warp pulse sequence for explaining the problem addressed by the inventive method.
Figure 2:
Figure 3:
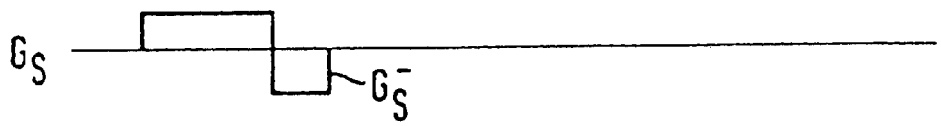
Figure 4:
Figure 5:
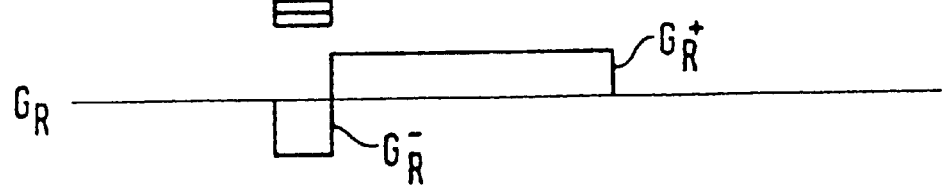
Figure 6:
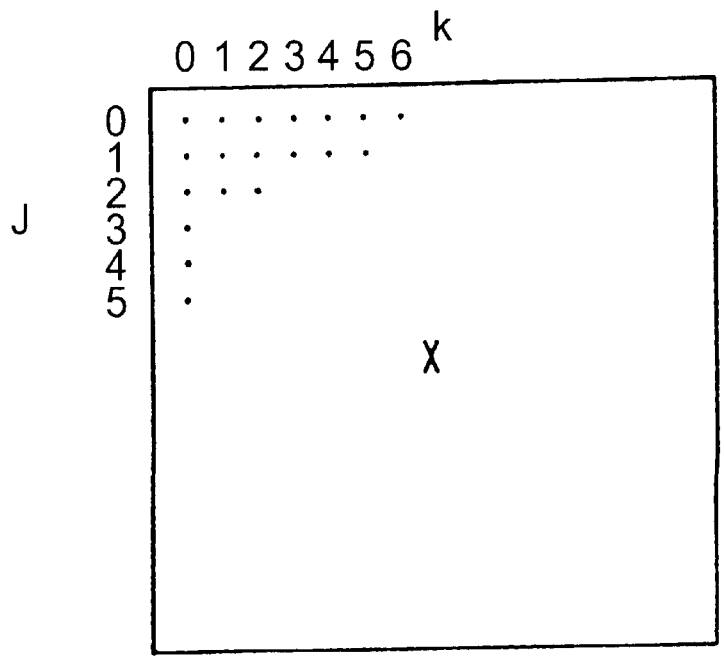
FIG. 6 schematically illustrates the arrangement of a measured data matrix generated according to the conventional pulse sequence shown in FIGS. 1–5, and used in the inventive method.

$\Upsilon$ = gyromagnetic ratio $G_R(t')$ = momentary value of the readout gradient $G_P(t')$ = momentary value of the phase-coding gradient $\rho(xy)$ = nuclear spin density Given the measured data matrix MD shown in FIG. 6, each row corresponds to a single nuclear magnetic resonance signal S. The sampling in the k-space ensues in successive rows given step-by-step switching of the phase-coding gradient $G_{PC}$. At the beginning of each sub-sequence, a phase-coding gradient $G_P$ whose gradient amplitude rises continuously in steps from sub-sequence to sub-sequence is respectively activated before the first nuclear magnetic resonance signal $S_1$. When, for example, each nuclear magnetic resonance signal is sampled with 256 measured points and 256 phase-coding steps are implemented, then a raw data matrix with 256 rows and 256 columns is obtained, i.e. 256×256 measured values in the k-space. The analog measured values obtained given the pulse sequence of FIGS. 1 through 5 are thus digitized onto a grid in the k-space. In the illustrated two-dimensional case, a row number j and a column number k is allocated to each digitized measured signal, referenced $x_{j,k}$ below. In order to obtain a image data matrix BD from the measured data matrix, the measured data matrix is Fourier-transformed both in row direction as well as in column direction. If a discrete Fourier transformation were thereby applied, then the following complex sums would have to be calculated for all k=0 ... N-1 for, for example, the Fourier transformation in column direction.

$$X_k = \sum_{j=0}^{N-1} xj w^{jk},$$

whereby X is an image data point and $w = e^{-2i\pi/N}$.

The same is true of the Fourier transformation in row direction. However, a considerable calculating outlay is thus involved.

The Fourier transformation can be implemented significantly more elegantly with the FFT (Fast Fourier Transform) algorithm. Given a matrix size of 512×512 measured points, the number of required calculating operations sinks to one one-hundredth. As already initially explained, the FFT algorithm, however, only functions for arrays whose length is a power of a number, whereby powers of 2 are normally employed. This limitation of the matrix size to specific numerical values, however, is disturbing in some instances.

In order to avoid this disadvantage, the inventive method makes use of the principle of discrete Fourier transformation, but achieves a solution wherein significantly fewer calculating steps are required than in the above-recited calculation of the complex sums. Namely, what is referred as a chirp-Z transformation algorithm (CZT) is applied. The following algebraic identity is utilized in this transformation algorithm:

$$jk = \frac{j^2 - (j-k)^2 + k^2}{2}$$

Figure 7:
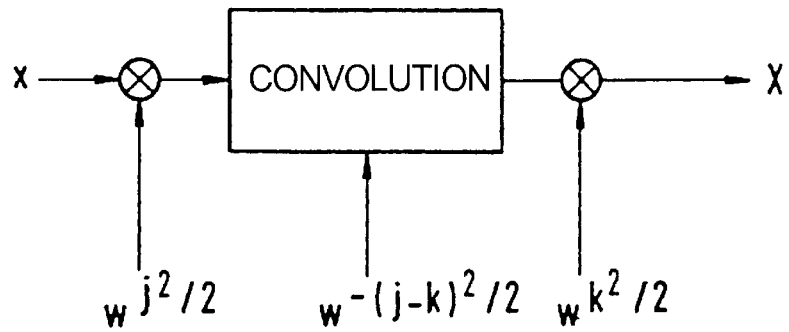
FIG. 7 is a block diagram illustrating the basic steps of the inventive method.

As shown in the block circuit diagram of FIG. 7, the CZT algorithm is realized in the following steps:

Each digitized measured signal x is multilied by a chirp $W^{j^2/2}$ (as shall be presented later, this effect is achieved in that the measured signals are acquired with a corresponding phase modulation).

A convolution ensues with a second chirp $w^{-(j-k)^2/2}$.

A multiplication ensues with a further chirp $w^{k^2/2}$.

Figure 8:
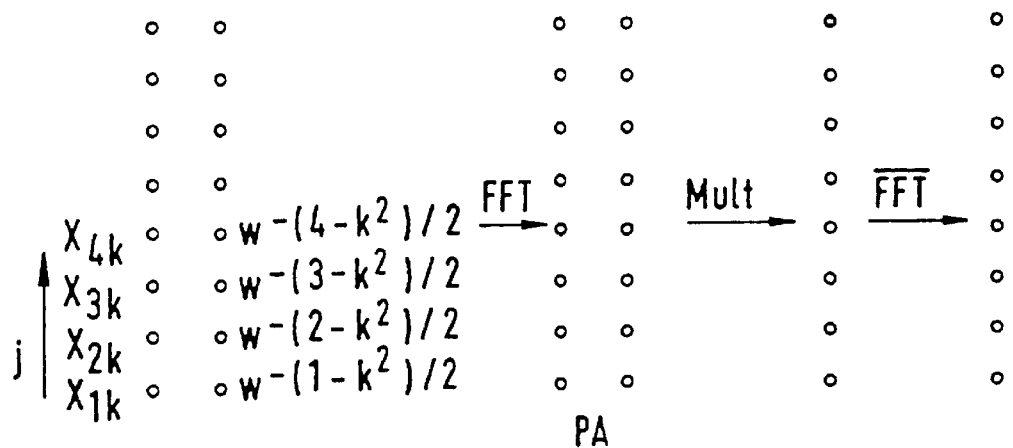
FIG. 8 is a chart illustrating the convolution steps in accordance with the principles of the present invention.

The most complicated operation is the convolution, whereby an array of N measured values $X_{j,k}$ must be convoluted with an array of N data points of the chirp $w^{-(j-k)^2/2}$ for each column k of the measured data matrix MD in the illustrated example. The steps thereby implemented for a column of the measured data matrix are shown in FIG. 8. First the two arrays for $x_{j,k}$ and $w^{-(j-k)^2/2}$ are brought to at least double the length by filling with zeroes. For clarity, the illustrated example proceeds on the basis of only four data points that each are brought to an array length of eight data points by filling with four zeroes. An FFT algorithm is applied to both arrays. The two Fourier-transformed arrays are multiplied point-by-point. An array is thus obtained to which an inverse FFT algorithm is applied. As a result, one finally again obtains an array with eight data points as result of the convolution. Only four of these data points are further-processed; the rest are discarded.

The filling with zeroes in the initial arrays has the purpose of avoiding over-convolutions in the application of the FFT algorithm. When the lowest value in the illustrated example is employed as zero point for the FFT algorithm, then the four lowest values in the initial array are further-processed.

Data that correspond to the result of a discrete Fourier transformation are obtained as result. It is thereby important that no demands are made of the length of the measured data sets in any of the illustrated steps, so that arbitrary matrix sizes can be processed, as in classic, discrete Fourier transformation.

With a given matrix length, the multiplication coefficients $w^{j^2/2}$ and $w^{k^2/2}$ as well as the Fourier transform of the chirp $w^{-(j-k)^2/2}$ represent fixed quantities that, expediently, are calculated once before the chirp transformation and stored in tables for later use. Given the illustrated chirp-Z transformation, one manages with significantly fewer calculating operations, measured in floating decimal point additions and multiplications, than in classic, discrete Fourier transformation. The corresponding values are shown compared in the table of FIG. 10 for different matrix lengths for the fast Fourier transformation (FFT), the chirp-Z transformation (CZT) and the discrete Fourier transformation. One can see that, given larger array lengths, the CZT operation is slower by approximately the factor 5 than the FFT operation involving the limitation with respect to array length. However, CZT is faster by the factor 20 compared to the DFT operation that does not involve these limitations.

Since FFT continues to be by far the fastest method, this will still be employed in those directions where it remains expedient on the basis of the array length and the use of CZT will be limited to those cases that cannot be processed with FFT. In three-dimensional imaging, for example, it could be advantageous to apply CZT only in the orthogonal direction to a slice where arbitrary thicknesses or resolutions of the slice are desired. A conventional matrix size of, for example, 512×512 points, by contrast, can be used in the other directions and, thus, the faster FFT transformation can continue to be used.

There are various possibilities of shortening the illustrated QZT method even further. For example, only a phase rotation is implemented with the multiplication by the chirp $w^{k^2/2}$ One can thus forego this multiplication step when the phase of the complex signals obtained is not evaluated but only the amount thereof is calculated.

Figure 9:
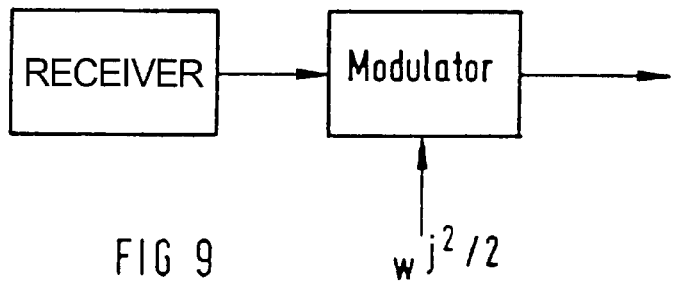
FIG. 9 is a block diagram showing radio-frequency modulation in accordance with the principles of the present invention.

According to the invention, the first multiplication step, as shown in FIG. 9, is achieved by radio-frequency phase modulation of the nuclear spin signal with the function $w^{j^2/2}$. This, namely, corresponds to a multiplication with the factor $w^{j^2/2}$.

Although modifications and changes may be suggested by those of ordinary skill in the art, it is the intention of the inventor to embody within the patent warranted hereon all changes and modifications as reasonably and properly come within the scope of his contribution of the art.

What is claimed is:

1. In a method for image acquisition from nuclear magnetic resonance signals entered into a measured data matrix having N rows with discrete k-space points (j,k), with a Fourier transformation being implemented in a first direction for all k=0 . . . N−1, the improvement comprising the steps of:

(a) receiving nuclear magnetic resonance signals and acquiring a data set of measured signals $(x_{j,k})$ by RF-phase modulating said received nuclear magnetic resonance signals in a modulator according to a first chirp $w^{j^2/2}$, wherein $w=e^{-2i\pi/N}$;

(b) convoluting said data set with a second chirp $w^{-(j-k)^2/2}$ to obtain a convoluted data set and entering said convoluted data set into an auxiliary data matrix;

(c) generating an image data matrix from the auxiliary data matrix by Fourier transformation thereof in at least one further direction; and (d) displaying an image obtained from the image data matrix.

2. A method as claimed in claim 1 comprising the additional step of multiplying the convoluted data in the auxiliary data matrix for all k=0. . . N−1 with a third chirp $w^{k^2/2}$.

3. A method as claimed in claim 2 comprising the additional step of storing values for the third chirp in a table.

4. A method as claimed in claim 1 wherein step (c) comprises generating the image data matrix by magnitude formation from a complex, completely Fourier-transformed data set.

5. A method as claimed in claim 1 wherein the step of convoluting with the second chirp comprises:

filling the data set acquired in step (a) with zeroes to obtain a first data array of at least twice a length of said data set and filling said second chirp with zeroes to obtain a second data array of at least twice a length of said second chirp;

fast Fourier transforming each of said first and second data arrays to obtain first and second fast Fourier-transformed arrays;

multiplying said first and second fast Fourier transformed arrays point-by-point to obtain a product and entering the product into a product array; and acquiring said convoluted data from the product array by inverse fast Fourier transformation of said product array.

6. A method as claimed in claim 1 comprising the additional step of storing values for the first chirp in a table before executing steps (a) and (b).

7. A method as claimed in claim 1 comprising the additional step of storing a fast Fourier-transformed second chirp in a table before executing steps (a) and (b).

8. A method as claimed in claim 1 wherein a Fourier transformation in steps (a) and (b) is implemented only for directions of said measured data matrix that do not comprise a data set length suitable for a fast Fourier transformation, and implementing fast Fourier transformations for other directions.

* * * * *